United States Patent
Ahmed et al.

(10) Patent No.: US 12,550,716 B2
(45) Date of Patent: Feb. 10, 2026

(54) PATTERNING METAL FEATURES ON A SUBSTRATE

(71) Applicant: Intel Corporation, Santa Clara, CA (US)

(72) Inventors: Shafaat Ahmed, Albuquerque, NM (US); Greg Herdt, Rio Rancho, NM (US)

(73) Assignee: Intel Corporation, Santa Clara, CA (US)

( * ) Notice: Subject to any disclaimer, the term of this patent is extended or adjusted under 35 U.S.C. 154(b) by 879 days.

(21) Appl. No.: 17/561,727

(22) Filed: Dec. 24, 2021

(65) Prior Publication Data

US 2023/0207459 A1    Jun. 29, 2023

(51) Int. Cl.
*H01L 23/528* (2006.01)
*H01L 21/768* (2006.01)
*H01L 23/532* (2006.01)

(52) U.S. Cl.
CPC .... *H01L 23/5283* (2013.01); *H01L 21/76816* (2013.01); *H01L 21/7682* (2013.01); *H01L 21/76843* (2013.01); *H01L 21/76877* (2013.01); *H01L 23/53238* (2013.01); *H01L 23/5329* (2013.01)

(58) Field of Classification Search
CPC ........... H01L 23/5283; H01L 21/76816; H01L 21/7682; H01L 21/76843; H01L 21/76877; H01L 23/53238; H01L 23/5329; H01L 21/743; H01L 23/5286; H01L 21/76885; H01L 23/535; H01L 21/76838
See application file for complete search history.

(56) References Cited

U.S. PATENT DOCUMENTS

| | | | |
|---|---|---|---|
| 2018/0174894 A1* | 6/2018 | Bouche | ................. H01L 21/308 |
| 2019/0237329 A1* | 8/2019 | Krysak | ..................... C01F 7/00 |
| 2020/0098629 A1 | 3/2020 | Lin | |

FOREIGN PATENT DOCUMENTS

WO    WO 2018/236354    12/2018

OTHER PUBLICATIONS

Search Report from European Patent Application No. 22206842.1, mailed Mar. 21, 2023, 7 pgs.
Notice of Allowance from European Patent Application No. 22206842.1, mailed Jun. 3, 2025, 48 pgs.
Notice of Allowance from European Patent Application No. 22206842.1, mailed Sep. 30, 2025, 49 pgs.

* cited by examiner

*Primary Examiner* — Patricia D Valenzuela
(74) *Attorney, Agent, or Firm* — Schwabe, Williamson & Wyatt P.C.

(57) ABSTRACT

Embodiments described herein may be related to apparatuses, processes, and techniques related to patterning and metallization to produce metal features on a substrate that have pitches less than 26 nm. Other embodiments may be described and/or claimed.

14 Claims, 12 Drawing Sheets

PATTERNING METAL FEATURES ON A SUBSTRATE

FIELD

Embodiments of the present disclosure generally relate to the field of semiconductor packaging, and in particular patterning metal features below 26 nm on a substrate.

BACKGROUND

Continued growth in virtual machines, cloud computing, and portable devices will continue to increase the demand for high density transistors within chips and packages.

DETAILED DESCRIPTION

Figure 1:
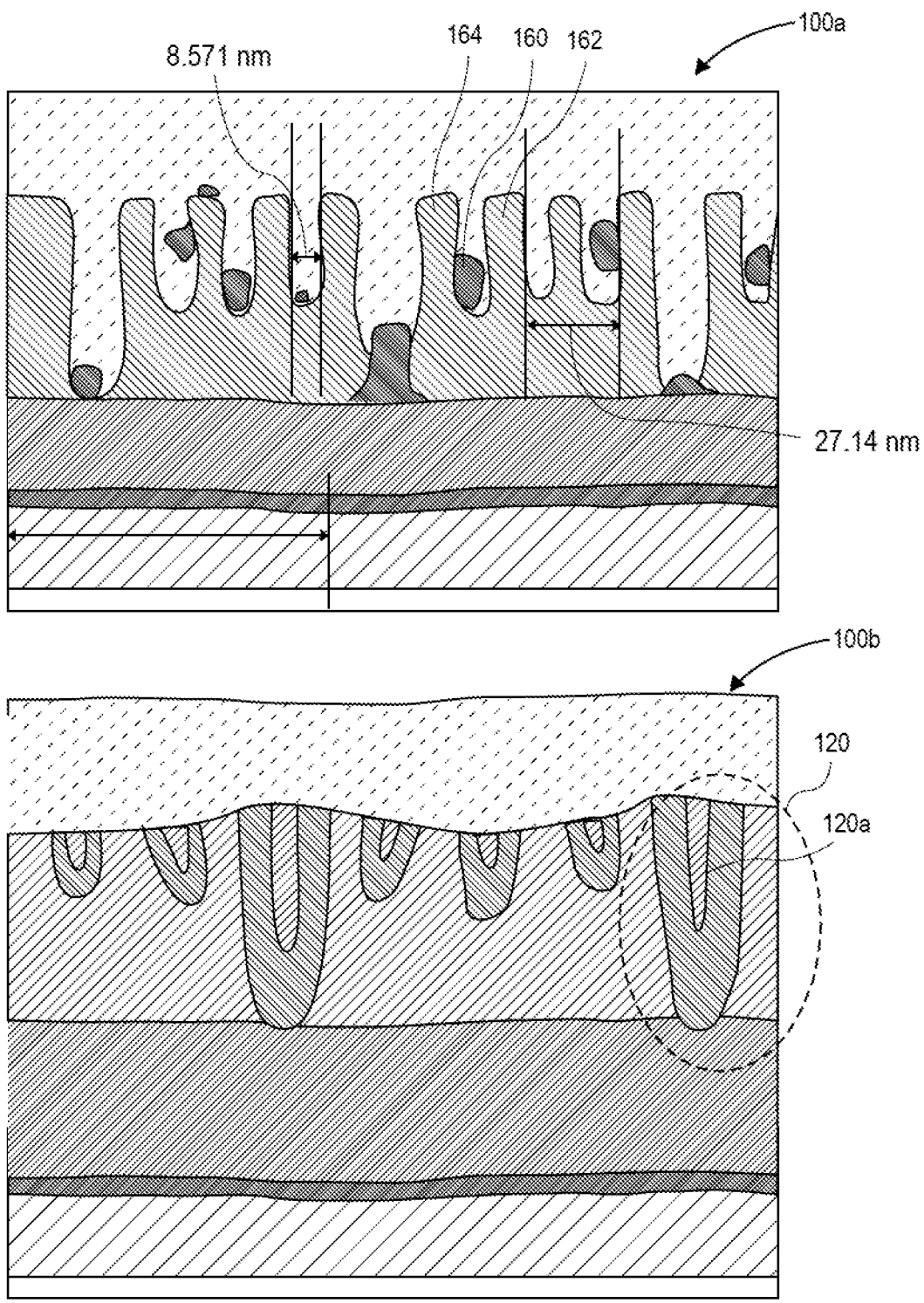
FIG. 1 illustrates cross section side views of legacy implementations of metal features formed by filling trenches.

Embodiments described herein may be related to apparatuses, processes, and techniques directed to patterning and metallization processes and structures to produce metal features on a substrate. In embodiments, these metal features have tighter pitches, in particular pitches less than 26 nm. In embodiments, these metal features may be used for scaled node CMOS or memory interconnect applications. In embodiments, techniques described herein may include patterning a spacer on a substrate, where the individual spacers have a pitch that is two times the pitch of a given node. A metal may then be conformally deposited onto the spacers, with the metal being deposited on either side of a spacer, creating a resulting metal feature having a pitch of the given node.

In embodiments, the resulting metal features are at a very narrow pitch in comparison with legacy implementations. In addition, the metal features have sides that are substantially perpendicular with respect to the substrate and have substantially reduced surface roughness as compared to sides of similar metal features produced using legacy implementation techniques described further below. In addition, the resulting metal features will be solid metal features, and will not include voids or seams within the metal feature in contrast to such metal features produced using legacy techniques.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

FIG. 1 illustrates cross section side views of legacy implementations of metal features formed by filling trenches. Image 100a shows a cross section side view of a legacy implementation of substrate that includes a plurality of metal features at a narrow pitch. In this legacy approach, a metal 160 is deposited within an etched trench formed between two edges 162, 164 of the dielectric. As shown, the deposition of the metal 160 is not uniform and does not completely fill the trench. In particular, metal fill in adjacent trenches may not be uniform due to local variations in cleans, patterning, and/or legacy etch processes.

Image 100b shows a cross section side view of a legacy metal feature 120 produced by a metal filled trench legacy process, where the metal feature 120, which includes molybdenum includes a void area 120a within the metal feature 120. Such void areas 120a are common with this legacy trench fill approach.

As technology advances, back end of line (BEOL) interconnects are scaling to increasingly tighter pitches. Patterning and metallization of these tighter pitches, especially in the <26 nm regime, is challenging. At these smaller pitches, the metal fill of trenches result in formation of voids or center-line seams. In legacy approaches to facilitate void-free fills in scaled damascene or dual-damascene structures, interconnect wires are usually tapered with a larger top opening size than the bottom width.

Another legacy option for scaling interconnects is to use subtractive etch of the metal and to fill the space between lines with dielectrics. A significant challenge in this approach is etching of thick metals while maintaining the mechanical integrity of the lines. This legacy approach can cause increased line roughness that adversely impacts line resistance due to the enhanced surface scattering. In addition, critical distance (CD) control and mechanical stability can be impacted by resist toppling as lines move to increasingly smaller CDs.

Common legacy interconnect processing paradigms entail a number of approaches. A first legacy approach involves deposition of dielectric layers and then processing of single/dual damascene structures that are subsequently filled then polished and capped. A second legacy approach involves a subtractive metallization scheme entailing deposition of one or more metal layers of interest, followed by patterning, and then subtractively etching the metals to form lines, and filling the intermetal spaces with dielectric.

These legacy approaches have disadvantages. In the damascene process, void free or seamless fill pose a challenge. Second, for interconnects using subtractive, some of the major disadvantages include the following. First, there are etch challenges associated with thicker metal layers. Second, sidewall oxidation and chemical interaction further contributes to the interconnect line resistance, which may be referred to as "deadlayer." Third, there may be significant line resistance impact from side wall roughness which is severe for the subtractive etch process. Fourth, tapered metal wires/lines are in profile, which impacts the electrical cross section/line resistance.

In addition, for these legacy implementations with very small line CDs, lateral etching from wet clean post dry etch could further weaken the mechanical integrity of the pattern lines and will cause collapse or toppling of the lines. In general, at smaller CDs, legacy requirements that use dry etch and wet clean pose increasingly tight constraints on processing.

Figure 2:
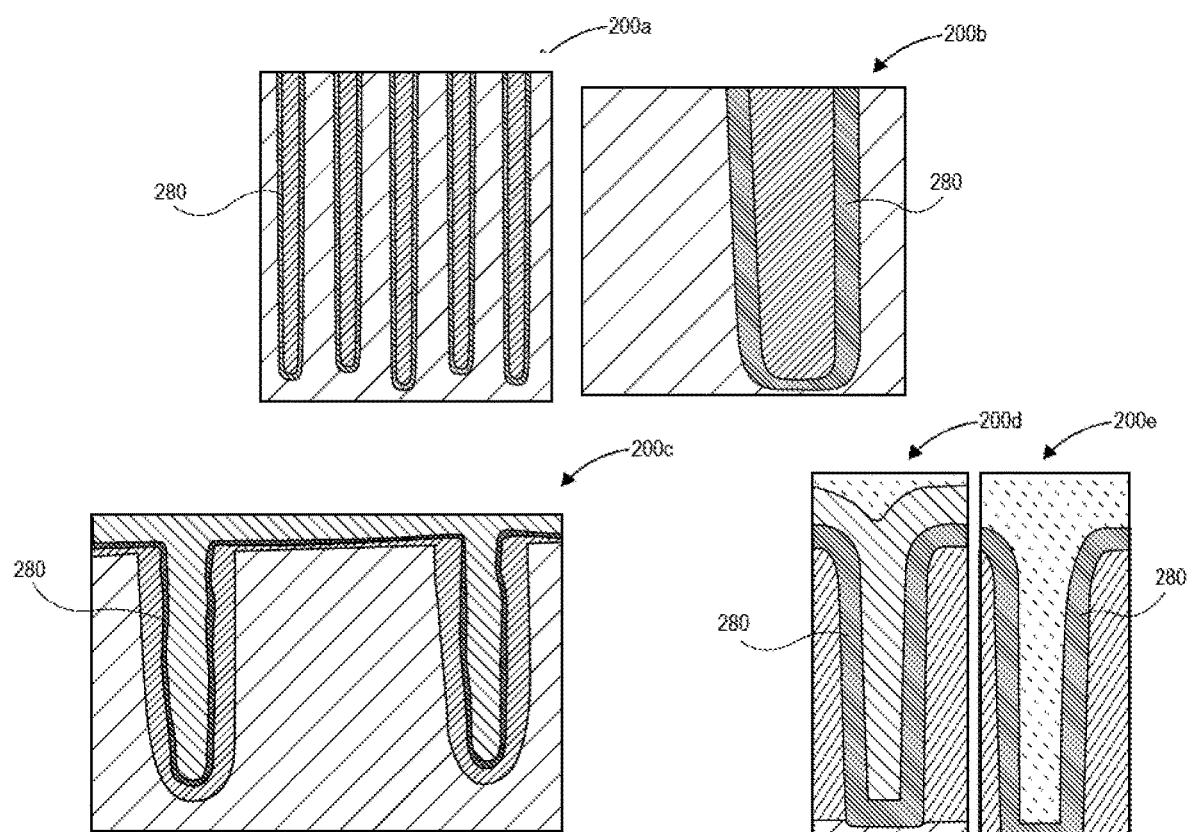
FIG. 2 illustrates cross section side views of legacy conformal deposition.

FIG. 2 illustrates cross section side views of conformal deposition. Diagrams 200a, 200b, 200c, 200d, and 200e show various side view examples of sides of conformal depositions 280. As shown, there are many characteristics of the depositions 280. For example, they are smooth, substantially planar, and have a uniform thickness throughout a length of the deposition 280. In addition, the depositions 280 are solid, without any voids or seams, and can be reliably reproduced.

Conformal depositions or super conformal depositions may be performed by one or more of an atomic layer deposition (ALD), chemical vapor deposition (CVD), physical vapor deposition (PVD), or electroplating process to deposit metal, barrier, and/or dielectric layers. These techniques may be used to produce very reliable depositions.

Figure 3A:
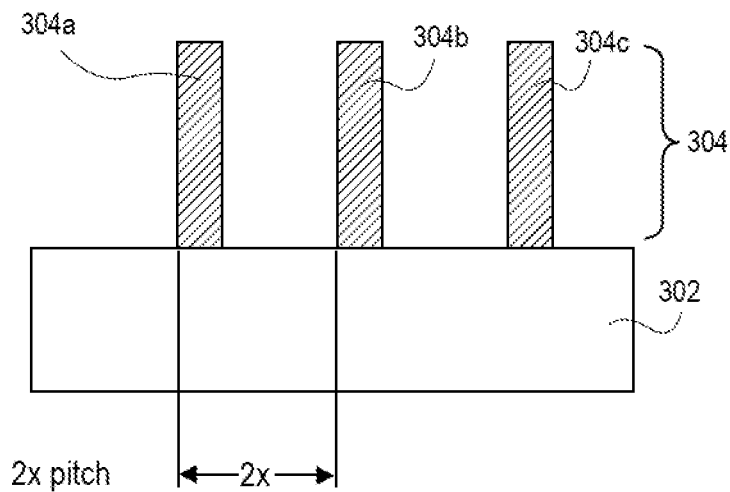
FIGS. 3A-3E illustrate stages in a manufacturing process for creating metal features with a pitch of 26 nm or less, in accordance with various embodiments.

FIGS. 3A-3E illustrate stages in a manufacturing process for creating metal features with a pitch of 26 nm or less, in accordance with various embodiments. FIG. 3A shows a stage in the manufacturing process where a substrate 302 is identified. Subsequently, a spacer pattern 304 is placed onto a surface of the substrate 302. In embodiments, each of the spacers 304a, 304b, 304c are patterned at two times (2×) of a desired pitch (1×) of metal features in the end device shown in FIG. 3E. In embodiments, desired pitch is 26 nm or less.

Figure 3B:
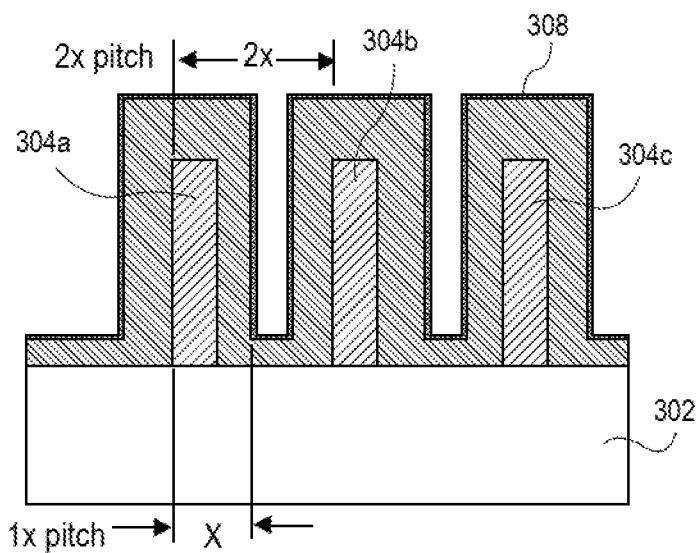

FIG. 3B shows a stage in the manufacturing process where a metal layer 308 is deposited on a surface of the substrate 302, and around the surface of each of the spacers 304a, 304b, 304c. In embodiments, the metal layer 308 may be conformally deposited using the techniques described above with respect to FIG. 2. In embodiments, the conformal deposition may be performed by ALD, CVD, PVD, and/or electroplating.

In some embodiments, a barrier layer (not shown) may be deposited onto the surface of the substrate 302, and around the surface of each of the spacers 304a, 304b, 304c, prior to the conformal deposition of the metal layer 308.

Figure 3C:
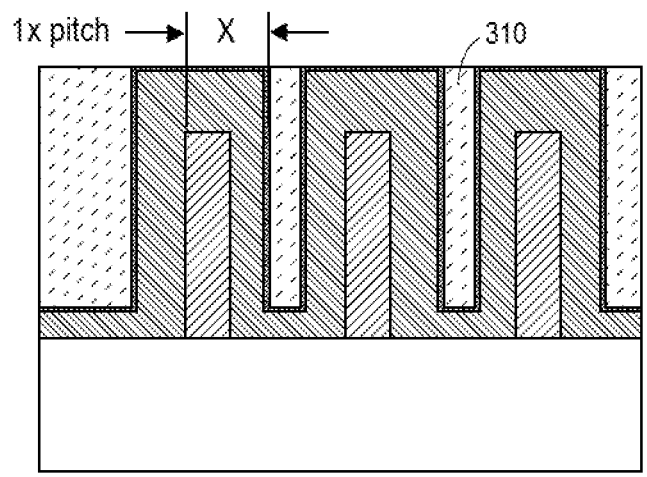

FIG. 3C shows a stage in the manufacturing process where a conformal dielectric film 310 is applied which covers, or caps, the metal layer 308. The dielectric film 310 is then polished to a surface of the metal layer 308.

Figure 3D:
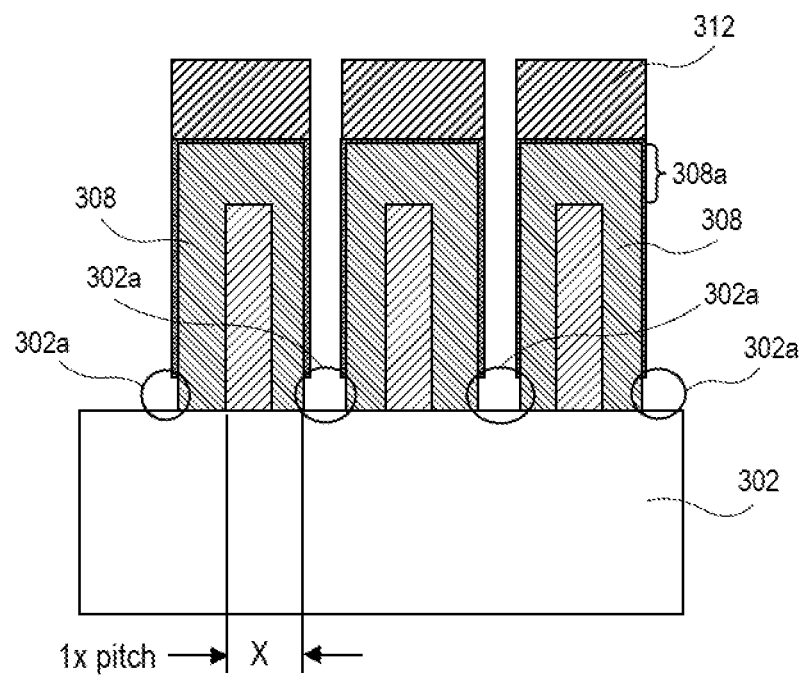

FIG. 3D shows a stage in the manufacturing process where a hard mask 312 is applied and patterned. The hard mask 312 and the dielectric film 310 are subsequently etched to expose surfaces 302a on the substrate 302. This may electrically isolate the portions of the metal layer 308 that surround spacers 304a, 304b, 304c from each other. In some embodiments, some of the metal surrounding some of the spacers may not be etched to provide electrical connectivity.

Figure 3E:
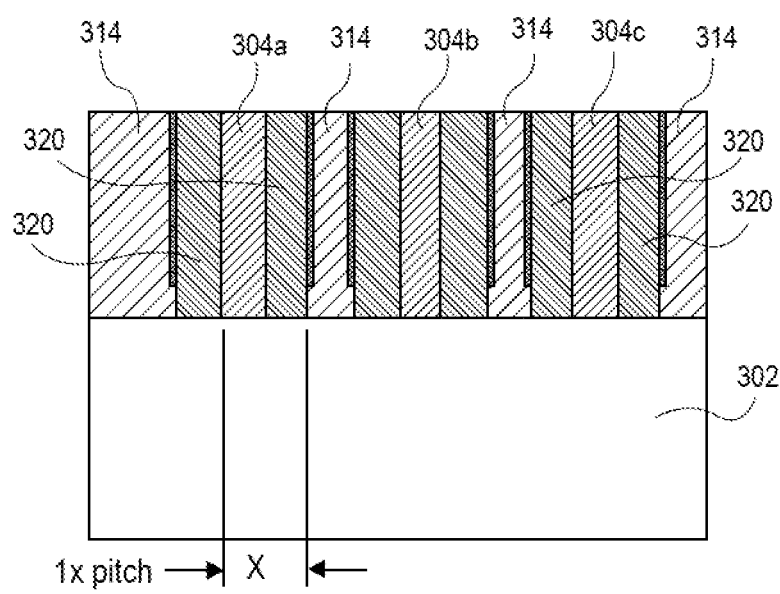

FIG. 3E shows a stage in the manufacturing process where a dielectric 314 is placed, and chemical-mechanical polishing (CMP) is performed to expose the final metal features 320, that are separated by the dielectric 314 and the spacers 304a, 304b, 304c. Note that the CMP process may remove the metal bridges 308a as a part of metal layer 308 (shown in FIG. 3D) to form the individual metal features 320 that are not electrically coupled. After this stage, the metal features 320 may be electrically coupled with wiring and/or interconnects (not shown).

Embodiments that result from the processes applied as discussed above with respect to FIGS. 3A-3E may facilitate and enable advanced node interconnect patterning and metallization. In embodiments, advanced node interconnects are interconnects with a sub-26 nm CD. In embodiments, the processes reduce surface roughness in comparison to legacy implementation, which a key contributor to reduced sidewall roughness. Reducing the roughness of the side of the metal features 320 will improve performance by reducing line resistance due to electron scattering that occurs with increased surface roughness. In embodiments, using a conformal deposition method will facilitate a closely square wire interconnect which will reduce line resistance as well as improve RC. Embodiments may also enable the use of an air gap (not shown), which can further improve RC, and may also avoid causes of toppling, resulting in improved mechanical integrity. In addition, because all depositions, including a barrier, can be performed in-situ, this eliminates a primary source of surface/interfacial oxidation on scaled interconnects, improving the resistance and reliability of the resulting interconnect lines and via.

In embodiments, the final dielectric 314, placed after the metal etch to break the bridge 308a, will form an interface between the initially deposited barrier or cap and post 1× spacer metal etch barrier or cap that would be readily detectable. In addition, embodiments may show little to no oxide and a minimum roughness for in-situ deposited metal and barrier and or cap on the side of the metal features 320.

Figure 4:
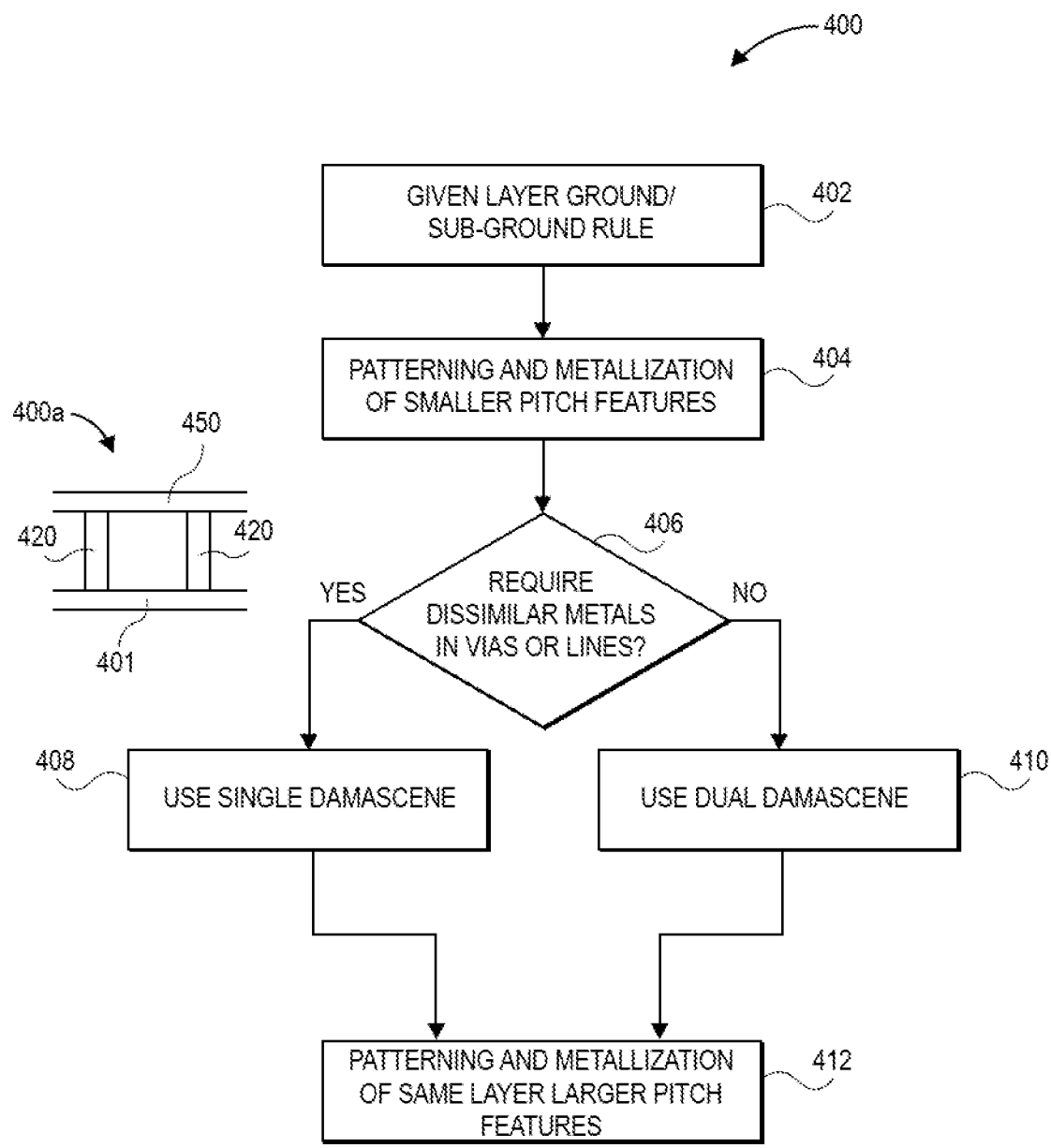
FIG. 4 illustrates an example flow for patterning and metallization, in accordance with various embodiments.

FIG. 4 illustrates an example flow for patterning and metallization, in accordance with various embodiments. Process flow 400 may be implemented by processes, techniques, apparatus, and/or systems disclosed herein with respect to FIGS. 2-3E and 6A-8.

At block 402, the process may include being given layer ground/sub-ground rules. In embodiments, these rules may include critical distances (CD) that are less than 12 nm, and may also include large feature metallization and patterning structures.

At block 404, the process may further include patterning and metallization of smaller pitch features. In embodiments, the smaller pitch features may be less than 26 nm pitch ground rule feature lines and vias. In embodiments, these features may be patterned and metallized using a single damascene or dual damascene process described herein.

At block 406, the process may further determine whether dissimilar metals are required in vias or lines. In embodiments, the different metals may include tungsten (W), cobalt (Co), Molybdenum (Mo), alloys that include these metals, or other refractory elements or alloys. FIG. 400a shows an example of these structures, where vias 420 couple with a lower substrate 401, and electrically couple with metal lines 450.

At block 408, if the determination of block 406 is that dissimilar metals are required, then metallization is accomplished using a single damascene process for the vias 420 and a single damascene process for the metal lines 450. The process then proceeds to block 412.

At block 410, if the determination of block 406 is that the same metals are to be used, then a dual damascene process is used for both the vias 420 and metal lines 450 for metallization.

At block 412, the process may then further include patterning and metallization of same layer larger pitch features. In embodiments, the same layer larger pitch features may be greater than 26 nm and pitch, or have dimensions using conventional interconnect processing. This conventional interconnect processing may include patterning, applying barrier seed, plating, and CMP processes.

Figure 5:
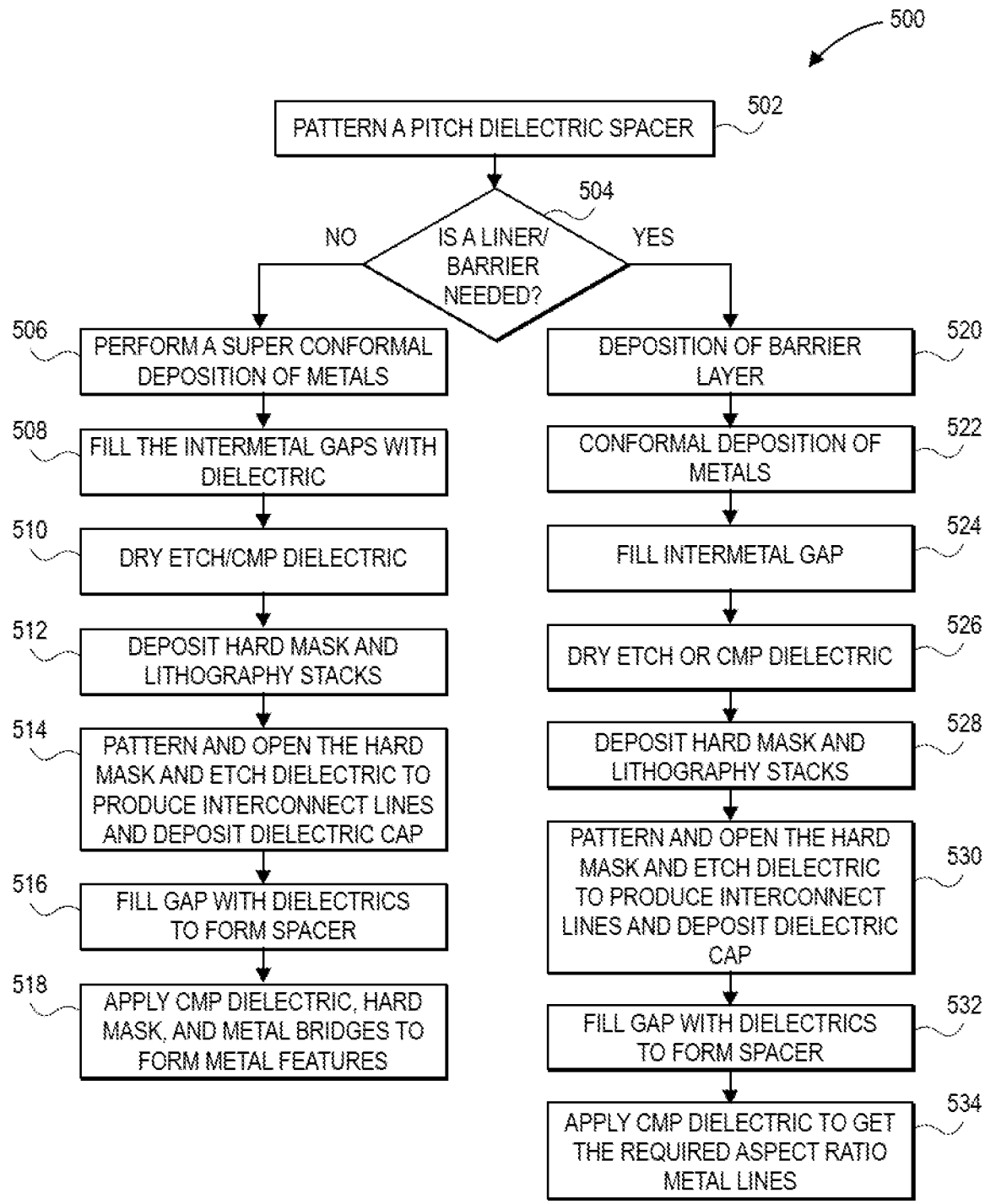
FIG. 5 illustrates an example flow for interconnect patterning and metallization, in accordance with various embodiments.

FIG. 5 illustrates an example flow for interconnect patterning and metallization, in accordance with various embodiments. Process flow 500 may be implemented by processes, techniques, apparatus, and/or systems disclosed herein with respect to FIGS. 2-3E and 6A-8. In embodiments, process flow 500 is directed to interconnect patterning and metallization process flow for smaller pitches that are less than 26 nm.

At block 502, the process may include patterning a 2× pitch dielectric spacer of a given node pitch interconnect. In embodiments, the 2× pitch may be similar to the 2× pitch shown with respect to FIG. 3A.

At block 504, the process may further include determining whether a liner or barrier is required. In embodiments, this is to identify whether a barrier layer is to be deposited in addition to the metal.

If at block 504, a liner or barrier is required, then at block 506, the process may further include performing a super conformal deposition of metals. In embodiments, this super conformal deposition of metals will be on the 2× spacer. The super conformal process may include ALD, CVD, PVD, or electroplating.

At block 508, the process may further include filling the intermetal gaps with a dielectric. In embodiments, the intermetal gaps will be a 1× spacer. In embodiments, the dielectric may be placed using various techniques including CVD or using a flowable dielectric.

At block 510, the process may further include dry etching or CMP of the dielectric. In embodiments, the dielectric may be removed to a level of the top of the metals placed at block 506.

At block 512, the process may further include depositing a hard mask and lithography stacks. In embodiments, the pattern may also be transferred.

At block 514, the process may further include patterning and opening the hard mask and etching the dielectric to produce interconnect lines, and deposit the dielectric cap. In embodiments, the dielectric cap may be deposited using conformal techniques.

At block 516, the process may further include filling the gap with dielectrics to form a spacer. In embodiments, the spacer may include an air gap.

At block 518, the process may further include applying a CMP to the dielectric, hard mask, and metal bridges to form the metal features. In embodiments, metal bridges, which may be similar to metal bridges 308a of FIG. 3D, are removed to get the metal features which may be similar to metal features 320 of FIG. 3E. In embodiments, the metals features may be metal lines that have an appropriate aspect ratio. After this block, the process may end.

Otherwise, if at block 504 a liner or barrier is not required, then at block 520 the process may include depositing a barrier layer. In embodiments, a conformal or super conformal deposition of a barrier may be made on the 2× pitch spacer. In embodiments, any additional treatment to the barrier may be applied.

At block 522, the process may further include a conformal deposition of metals. In embodiments, a conformal deposition of metals and then subsequently a barrier may be placed on top of the spacer.

At block 524, the process may include filling the intermetal gap. In embodiments, the gap is a 1× spacer that may be filled by dielectric using, for example, CVD or flowable dielectric material.

At block 526, the process may further include dry etching or CMP of the dielectric. In embodiments, the dielectric may be removed to a level of the top of the metals placed at block 520.

At block 528, the process may further include depositing a hard mask and lithography stacks. In embodiments, the pattern may also be transferred.

At block 530, the process may further include patterning and opening the hard mask and etching the dielectric to produce interconnect lines, and deposit the dielectric cap. In embodiments, the dielectric cap may be deposited using conformal techniques.

At block 532, the process may further include filling the gap with dielectrics with or without an air gap to form a spacer.

At block 534, the process may further include applying a CMP to the dielectric, hard mask, and metal bridges to form the metal features. In embodiments, metal bridges, which may be similar to metal bridges 308a of FIG. 3D, are removed to get the metal features which may be similar to metal features 320 of FIG. 3E. In embodiments, the metal features may be metal lines that have an appropriate aspect ratio. After this block, the process may end.

Figure 6A:
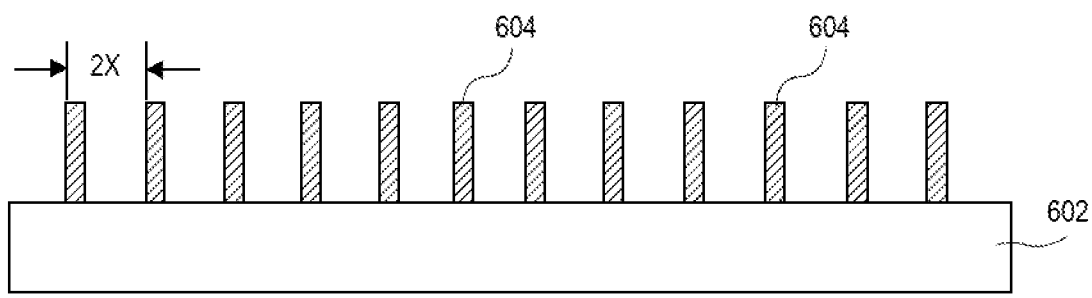
FIGS. 6A-6H illustrate stages in a manufacturing process for forming small pitch interconnect patterning and metallization on a substrate, in accordance with various embodiments.

FIGS. 6A-6H illustrate stages in a manufacturing process for forming small pitch interconnect patterning and metallization on a substrate, in accordance with various embodiments. FIG. 6A shows a stage in the manufacturing process where a substrate 602 is provided, spacers 604 are patterned at a 2× pitch on the substrate 602. In embodiments, known techniques may be used to produce the spacers 604 from a dielectric material. Note that the 2× pitch is used with this technique to produce 1× pitch metal features as described below with respect to FIG. 6H. In embodiments, the pitch of the spacer 604 may be less than or equal to 26 nm.

Figure 6B:
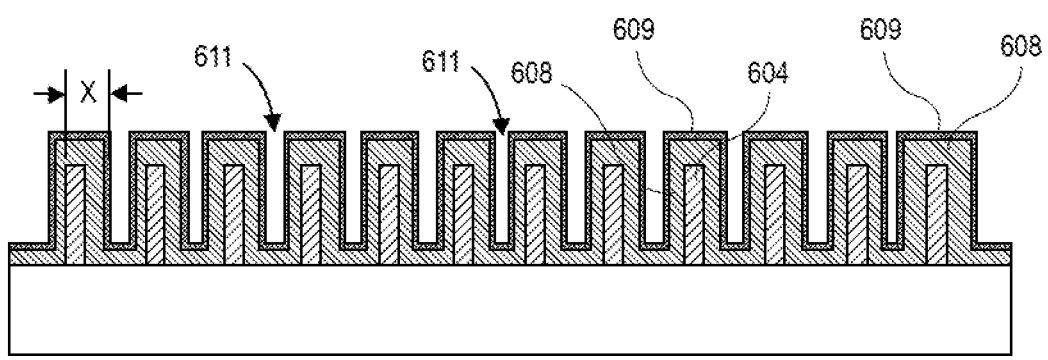

FIG. 6B shows a stage in the manufacturing process where metal layers 608 are conformally deposited onto the spacers 604. In embodiments, a barrier 609 may be subsequently conformally deposited onto the metal layer 608. In other embodiments, not shown here, a liner (not shown) may be deposited on the spacer 604 prior to the deposition of the metal layer 608. In embodiments, the conformal deposition process may use one or more of ALD, CVD, PVD, or electroplating processes. As a result, gap 611 may be formed. In embodiments, a plasma, annealing, or cure treatment may be applied, either between the processes of deposition of the metal layer 608 and the barrier 609, or after deposition of both metal layer 608 and barrier 609.

Figure 6C:
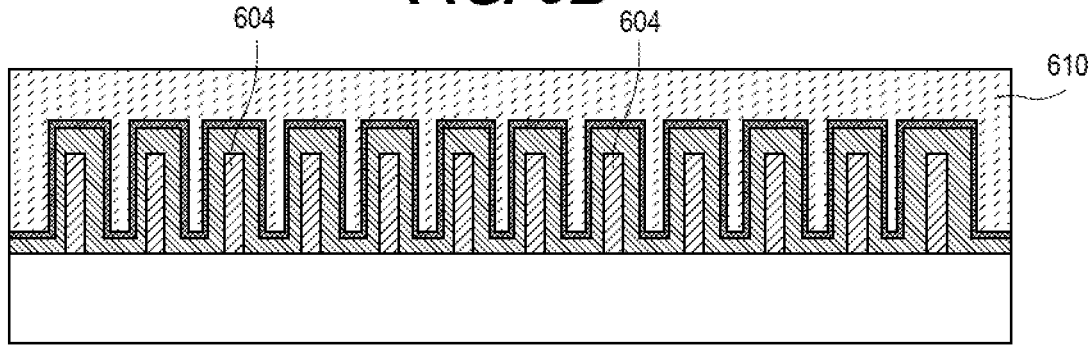

FIG. 6C shows a stage in the manufacturing process where a dielectric 610 is placed to fill the gaps between the spacers 604. In embodiments, the dielectric 610 may be a sacrificial dielectric. In embodiments, instead of a dielectric 610, a carbon film may applied. In embodiments, the dielectric 610 may be placed using deposition or spin casting, or a combination of both.

Figure 6D:
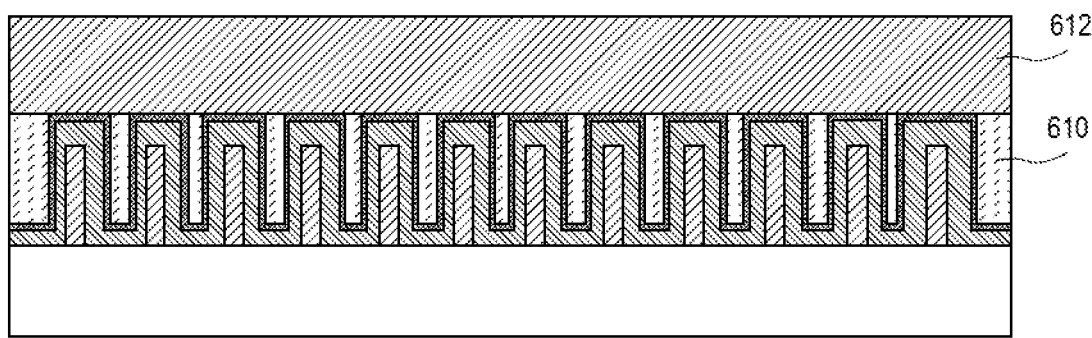

FIG. 6D shows a stage in the manufacturing process where a portion of the dielectric 610 is removed, and a hard mask 612 is applied. In embodiments, the portion of the dielectric 610 may be removed using a dry etchback or a CMP process. In embodiments, a portion of the dielectric 610 may be removed to the barrier 609, or to the metal layer 608 if there is no barrier 609. A hard mask 612, after applied, may then have a lithography stack deposited in a pattern transferred to open up the gap 611 from FIG. 6B. In embodiments, a width of the dielectric 610 may be extended if a different, for example a wider metal pitch is required on the same level.

Figure 6E:
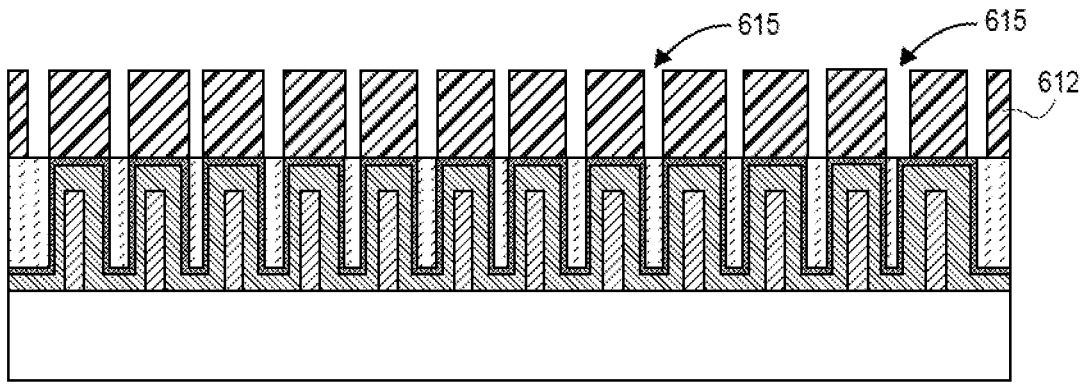

FIG. 6E shows a stage in the manufacturing process where the lithography step is performed and the hard mask 612 is etched to produce cavity 615, which aligns with gap 611 of FIG. 6B.

Figure 6F:
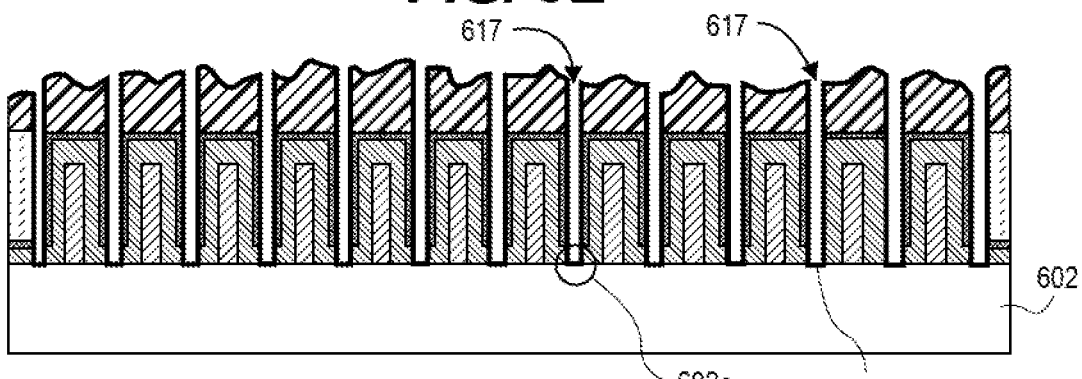

FIG. 6F shows a stage in the manufacturing process where etching occurs to form gaps 617 that extend to areas 602a of the substrate 602. In embodiments, the etch etches the dielectric 610, and a portion of the metal layer 608 and/or barrier 609 to the substrate 602. This step completely breaks the continuity of the metal layer 608 of FIG. 6B.

Figure 6G:
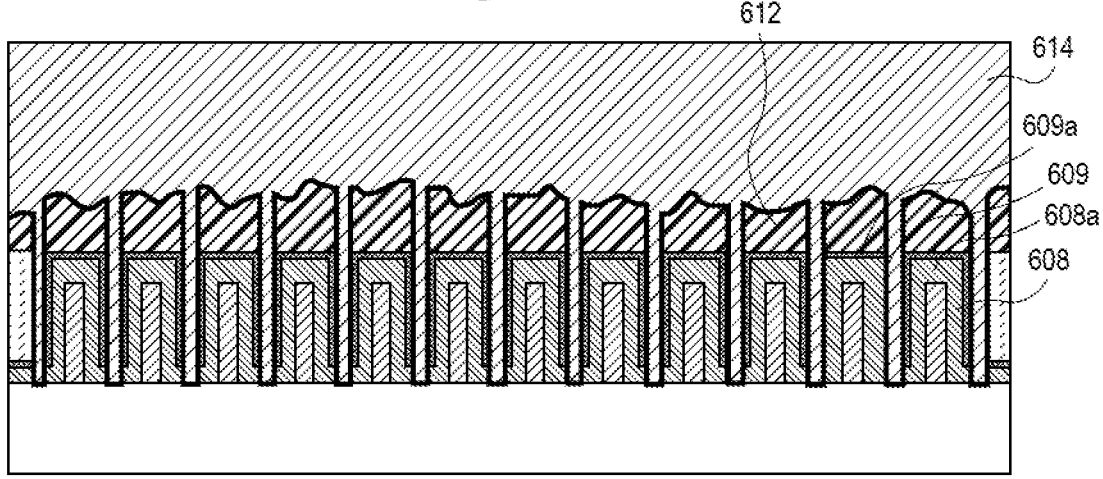

FIG. 6G shows a stage in the manufacturing process where a dielectric 614 is applied.

Figure 6H:
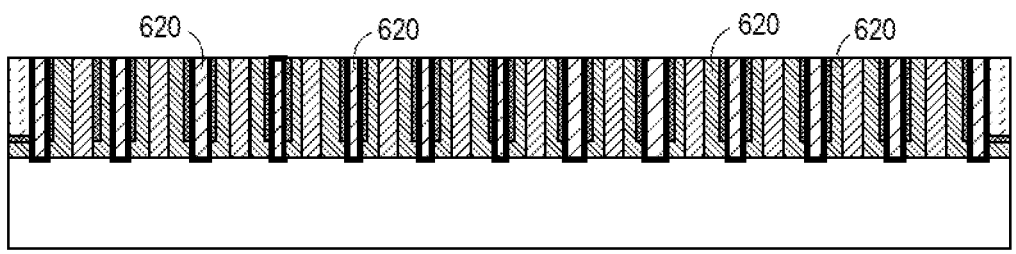

FIG. 6H shows stage the manufacturing process where a CHIP or etch process is performed to expose the metal features 620, which are in a 1× pitch. In embodiments, the etch process removes the hard mask 612, top barrier layer 609a of barrier 609, and top metal layer 608a of metal layer 608.

Figure 7A:
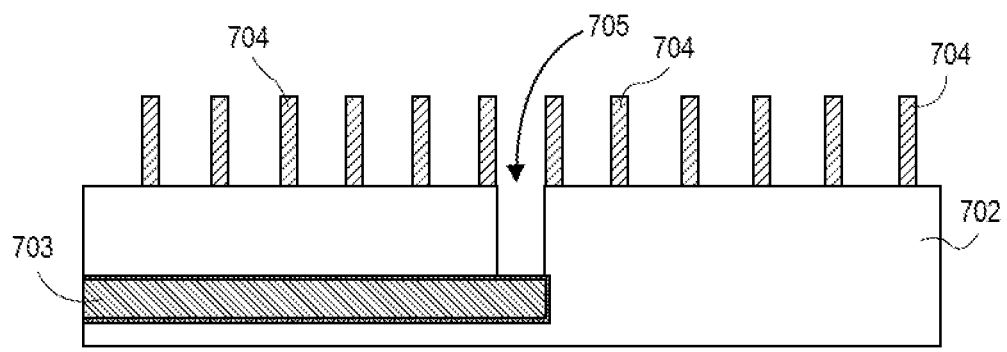
FIGS. 7A-7D illustrate stages in a manufacturing process for a interconnect patterning and metallization with an underlying metal within a substrate, in accordance with various embodiments.

FIGS. 7A-7D illustrate stages in a manufacturing process for a interconnect patterning and metallization with an underlying metal within a substrate, in accordance with various embodiments. FIGS. 7A-7D illustrate stages in a dual damascene process of smaller pitch similar metals. FIG. 7A shows a stage in the manufacturing process where a substrate 702 is provided, with an underlying metal 703 embedded within the substrate. In embodiments, the underlying metal 703 may be one or more routing lines within the substrate 702. In embodiments, a cavity 705, which may also be referred to as a via, may be formed within one side of the substrate 702 and extend to connect with a portion of the underlying metal 703. In embodiments, the cavity 705 may be formed using known techniques.

In addition, spacers 704, which may be similar to spacer 604 of FIG. 6A, are formed on a side of the substrate 702, and are placed at a 2× pitch. In embodiments, the spacer 704 may be a dielectric material. In embodiments, spacers 704 may be placed before the cavity 705 is formed.

Figure 7B:
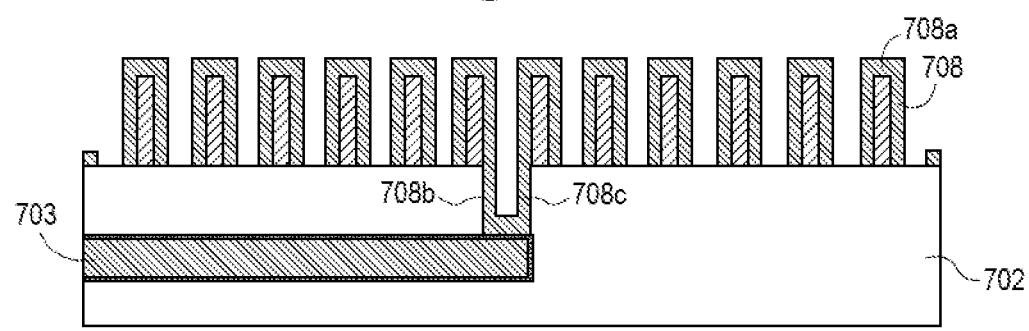

FIG. 7B shows a stage in the manufacturing process where a metal 708 is conformally deposited onto the spacers 704, the top of the substrate 702, and into the cavity 705. In embodiments, the metal 708 may be similar to metal layer 308 of FIG. 3B or metal layer 608 of FIG. 6B. In embodiments, the conformal deposition may include one or more of ALD, CVD, PVD, or electroplating processes. A metal bridge 708a may form over the spacers 704. In embodiments, metal links 708b, 708c may extend into the cavity 705 and electrically couple with the underlying metal 703.

Figure 7C:
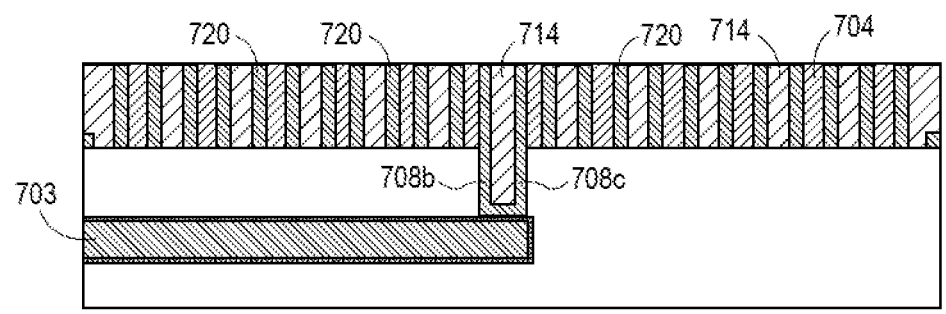

FIG. 7C shows a stage in the manufacturing process where both metal links 708b, 708c electrically couple with the underlying metal 703. In embodiments, a dielectric 714 may be applied, either through a CVD or a flow process, and a CMP process subsequently performed to produce metal features 720, with both metal links 708b, 708c electrically coupled with the underlying metal 703.

Figure 7D:
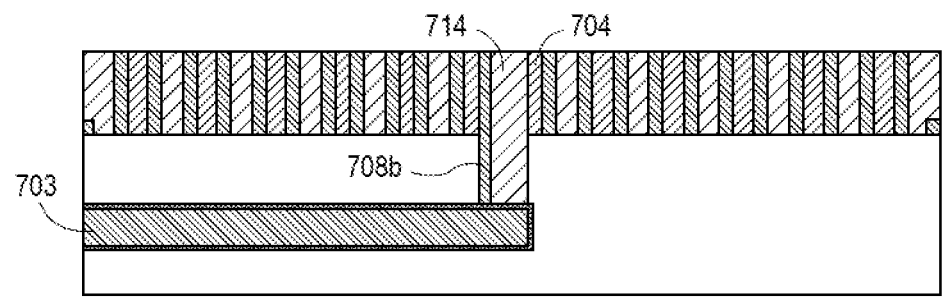

FIG. 7D shows an alternative stage in the manufacturing process, subsequent to FIG. 7B, where the metal feature that is above and in line with metal link 708c is etched away prior to deposition of the dielectric 714, and subsequent CMP process to produce metal features 720. Thus, only one metal link 708b is electrically coupled with the underlying metal 703.

Figure 8:
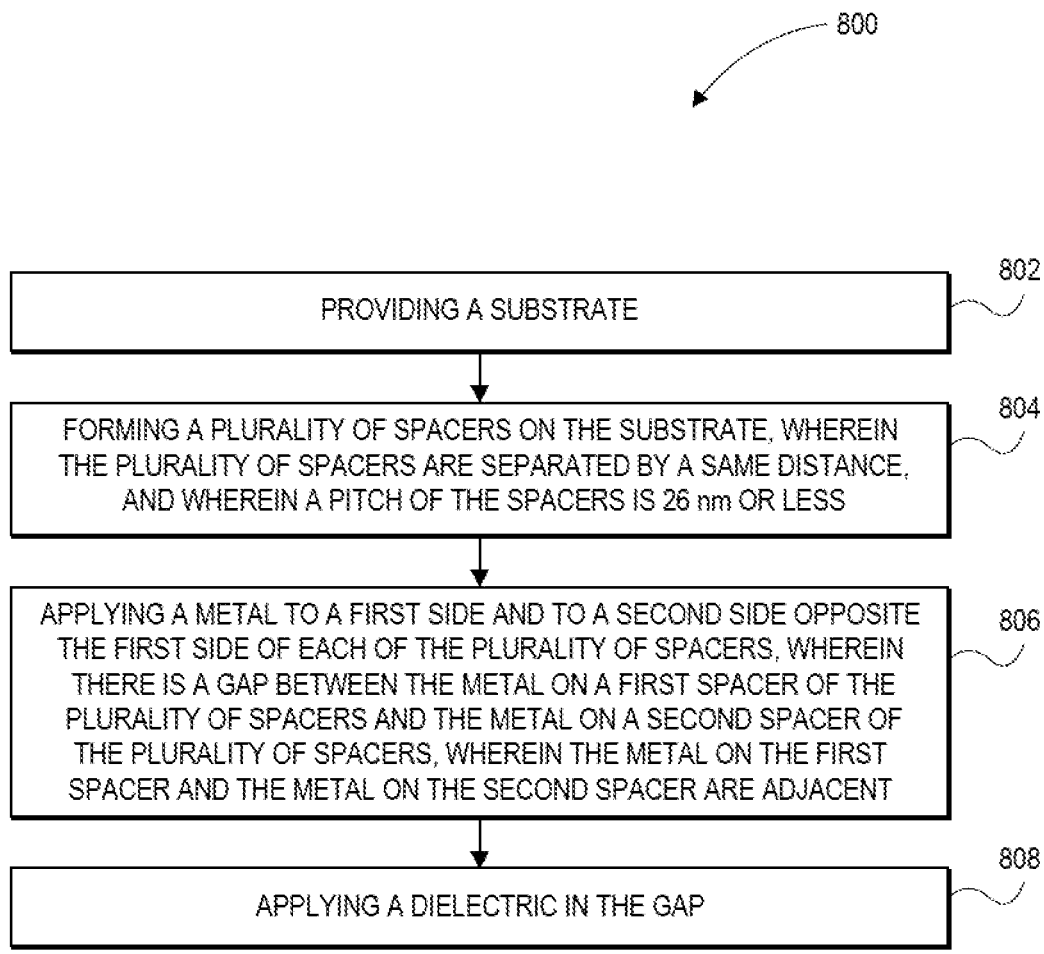
FIG. 8 illustrates an example process forming a substrate with a metal features having a pitch of less of 26 nm or less, in accordance with various embodiments.

FIG. 8 illustrates an example process forming a substrate with a metal features having a pitch of less of 26 nm or less, in accordance with various embodiments.

At block 802, the process may include providing a substrate.

At block 804, the process may further include forming a plurality of spacers on the substrate, wherein the plurality of spacers are separated by a same distance, and wherein a pitch of the spacers is 26 nm or less.

At block 806, the process may further include applying a metal to a first side and to a second side opposite the first side of each of the plurality of spacers, wherein there is a gap between the metal on a first spacer of the plurality of spacers and the metal on a second spacer of the plurality of spacers, wherein the metal on the first spacer and the metal on the second spacer are adjacent.

At block 808, the process may further include applying a dielectric in the gap.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or gate-all-around transistors such as nanoribbon and nanowire transistors. Although the implementations described herein may illustrate only Finfet transistors, it should be noted that the invention may also be carried out using planar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 9:
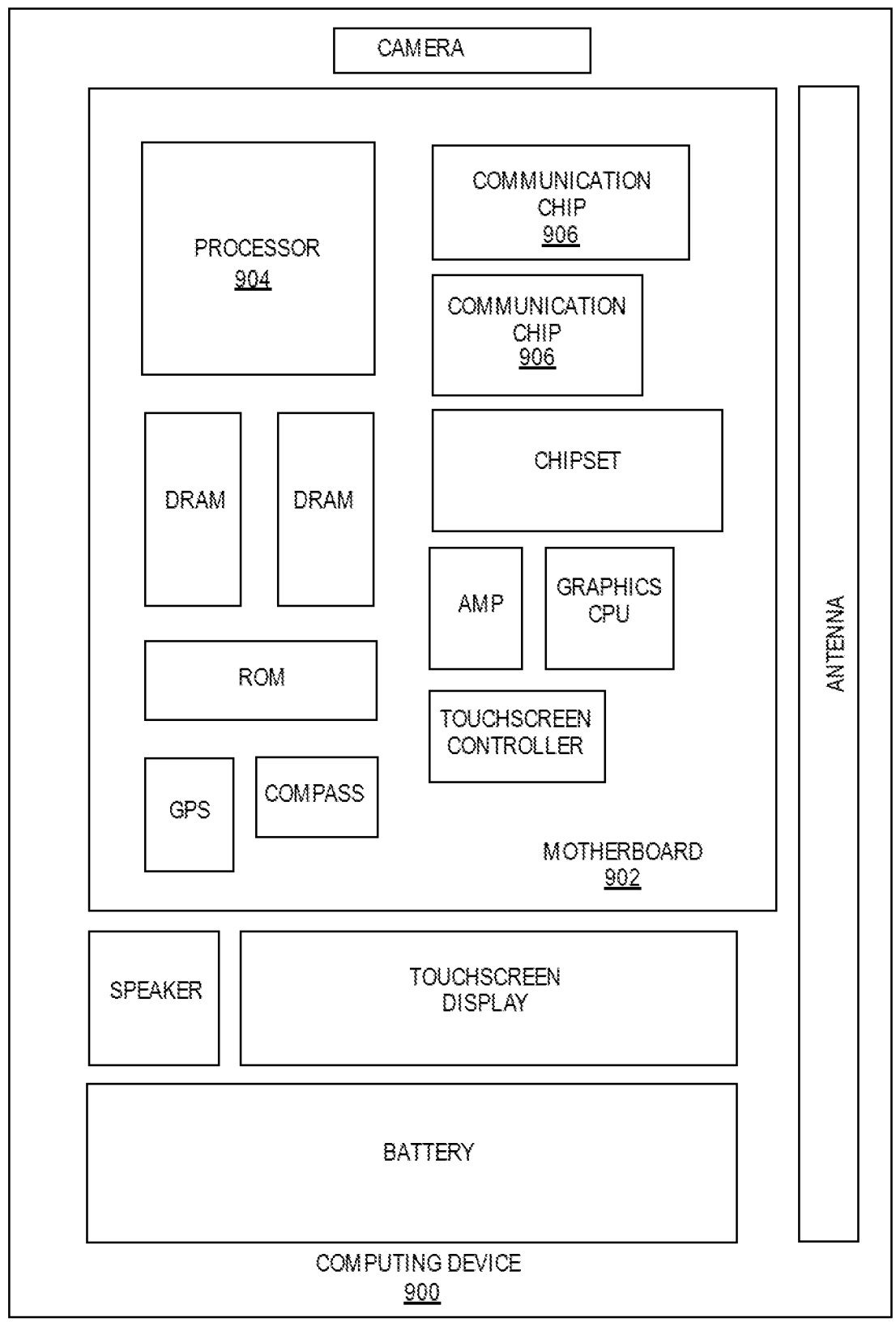
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as MOS-FET transistors built in accordance with implementations of the invention.

In further implementations, another component housed within the computing device 900 may contain an integrated circuit die that includes one or more devices, such as MOS-FET transistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Figure 10:
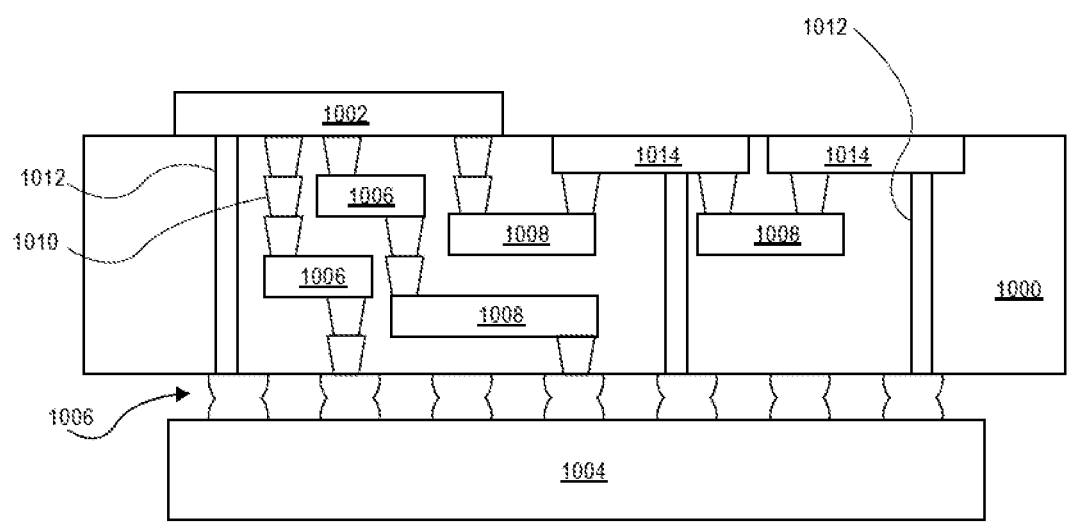
FIG. 10 illustrates an interposer that includes one or more embodiments of the invention.

FIG. 10 illustrates an interposer 1000 that includes one or more embodiments of the invention. The interposer 1000 is an intervening substrate used to bridge a first substrate 1002 to a second substrate 1004. The first substrate 1002 may be, for instance, an integrated circuit die. The second substrate 1004 may be, for instance, a memory module, a computer motherboard, or another integrated circuit die. Generally, the purpose of an interposer 1000 is to spread a connection to a wider pitch or to reroute a connection to a different connection. For example, an interposer 1000 may couple an integrated circuit die to a ball grid array (BGA) 1006 that can subsequently be coupled to the second substrate 1004. In some embodiments, the first and second substrates 1002/1004 are attached to opposing sides of the interposer 1000. In other embodiments, the first and second substrates 1002/1004 are attached to the same side of the interposer 1000. And in further embodiments, three or more substrates are interconnected by way of the interposer 1000.

The interposer 1000 may be formed of an epoxy resin, a fiberglass-reinforced epoxy resin, a ceramic material, or a polymer material such as polyimide. In further implementations, the interposer 1000 may be formed of alternate rigid or flexible materials that may include the same materials described above for use in a semiconductor substrate, such as silicon, germanium, and other group III-V and group IV materials.

The interposer 1000 may include metal interconnects 1008 and vias 1010, including but not limited to through-silicon vias (TSVs) 1012. The interposer 1000 may further include embedded devices 1014, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1000. In accordance with embodiments of the invention, apparatuses or processes disclosed herein may be used in the fabrication of interposer 1000.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

The following paragraphs describe examples of various embodiments.

EXAMPLES

Example 1 is an apparatus comprising: a substrate; a plurality of metal features on the substrate, wherein the plurality of metal features has a pitch of less than 26 nm; and wherein each of the plurality of metal features on the substrate is a solid metal feature without an interior void.

Example 2 may include the apparatus of example 1, or of any other example or embodiment herein, wherein one of the plurality of metal features has a first dielectric on a first edge of the metal feature and a second dielectric on a second edge of the metal feature opposite the first edge of the metal feature.

Example 3 may include the apparatus of example 2, or of any other example or embodiment herein, wherein the first dielectric and the second dielectric are different materials.

Example 4 may include the apparatus of example 2, or of any other example or embodiment herein, further comprising a barrier layer between the first edge of the metal feature and the first dielectric.

Example 5 may include the apparatus of example 2, or of any other example or embodiment herein, wherein the first edge of the metal feature and the second edge of the metal feature are substantially perpendicular to a plane of the substrate.

Example 6 may include the apparatus of example 1, or of any other example or embodiment herein, further comprising: an electrically conductive metal within the substrate below the plurality of metal features, wherein at least one of the plurality of metal features extends through the substrate and electrically couples with the electrically conductive metal.

Example 7 may include the apparatus of example 6, or of any other example or embodiment herein, wherein a first metal feature and a second metal feature extend through the substrate and electrically coupled with the electrically conductive metal, wherein the first metal feature and the second metal feature are adjacent.

Example 8 may include the apparatus of example 1, or of any other example or embodiment herein, wherein each of the plurality of metal features on the substrate does not have an interior seam.

Example 9 may include the apparatus of example 1, or of any other example or embodiment herein, wherein the plurality of metal features are a portion of a routing layer.

Example 10 may include the apparatus of example 1, or of any other example or embodiment herein, wherein the plurality of metal features form a memory interconnect.

Example 10.1 may include the apparatus of example 10, or of any other example or embodiment herein, wherein the interconnect is for a selected one or more of: a logic back end of the line, a memory, or one or more packages.

Example 11 may include the apparatus of example 1, or of any other example or embodiment herein, wherein the plurality of metal features are formed using atomic layer deposition (ALD), chemical vapor deposition (CVD), physical vapor deposition (PVD), and/or electroplating.

Example 12 may include the apparatus of example 1, or of any other example or embodiment herein, further comprising a top metal layer, wherein a subset of the metal features are electrically coupled with the top metal layer at a top side of the subset of the metal features opposite the substrate.

Example 13 may include the apparatus of example 1, or of any other example or embodiment herein, wherein the metal features include copper.

Example 14 may include the apparatus of example 1, or of any other example or embodiment herein, wherein a width of the first dielectric and a width of the second dielectric are substantially a same width.

Example 15 is a method comprising: providing a substrate; forming a plurality of spacers on the substrate, wherein the plurality of spacers are separated by a same distance, and wherein a pitch of the spacers is 26 nm or less; applying a metal to a first side and to a second side opposite the first side of each of the plurality of spacers, wherein there is a gap between the metal on a first spacer of the plurality of spacers and the metal on a second spacer of the plurality of spacers, wherein the metal on the first spacer and the metal on the second spacer are adjacent; and applying a dielectric in the gap.

Example 15.1 may include the method of example 15, or of any other example or embodiment herein, wherein applying a dielectric in the gap further includes applying the dielectric with an air gap or without an air gap.

Example 16 may include the method of example 15, or of any other example or embodiment herein, wherein applying a metal further includes applying the metal using a selected one or more of: atomic layer deposition (ALD), chemical vapor deposition (CVD), physical vapor deposition (PVD), or electroplating.

Example 17 may include the method of example 15, or of any other example or embodiment herein, wherein after the step of applying a metal, the method further includes removing a portion of the applied metal to electrically isolate the metal on the first side and on the second side of the plurality of spacers from each other.

Example 18 may include the method of example 15, or of any other example or embodiment herein, wherein the dielectric is a first dielectric and wherein a spacer includes a second dielectric.

Example 19 is a package comprising: a die; a substrate coupled with the die, the substrate including: a plurality of metal routings on the substrate, wherein the plurality of metal routings have a pitch of less than 26 nm; and wherein each of the plurality of metal routings on the substrate is a solid metal feature without an interior void and without an interior seam; and wherein the die is electrically coupled with at least some of the metal routings.

Example 20 may include the package of example 19, or of any other example or embodiment herein, wherein the metal routings include copper.

What is claimed is:

1. An apparatus comprising:
    a substrate;
    a plurality of metal features above the substrate, wherein the plurality of metal features has a pitch of less than 26 nm;
    wherein each of the plurality of metal features above the substrate is a solid metal feature without an interior void;

wherein one of the plurality of metal features has a first dielectric on a first edge of the metal feature and a second dielectric on a second edge of the metal feature opposite the first edge of the metal feature; and a barrier layer between the first edge of the metal feature and the first dielectric, the barrier layer along less than an entirety of the first edge of the metal feature.

2. The apparatus of claim 1, wherein the first dielectric and the second dielectric are different materials.

3. The apparatus of claim 1, wherein the first edge of the metal feature and the second edge of the metal feature are substantially perpendicular to a plane of the substrate.

4. The apparatus of claim 1, further comprising:

an electrically conductive metal within the substrate below the plurality of metal features, wherein at least one of the plurality of metal features extends through the substrate and electrically couples with the electrically conductive metal.

5. The apparatus of claim 4, wherein a first metal feature and a second metal feature extend through the substrate and electrically coupled with the electrically conductive metal, wherein the first metal feature and the second metal feature are adjacent.

6. The apparatus of claim 1, wherein each of the plurality of metal features on the substrate does not have an interior seam.

7. The apparatus of claim 1, wherein the plurality of metal features are a portion of a routing layer.

8. The apparatus of claim 1, wherein the plurality of metal features form a memory interconnect.

9. The apparatus of claim 1, wherein the plurality of metal features are formed using atomic layer deposition (ALD), chemical vapor deposition (CVD), physical vapor deposition (PVD), and/or electroplating.

10. The apparatus of claim 1, further comprising a top metal layer, wherein a subset of the metal features are electrically coupled with the top metal layer at a top side of the subset of the metal features opposite the substrate.

11. The apparatus of claim 1, wherein the apparatus is a die.

12. The apparatus of claim 1, wherein a width of the first dielectric and a width of the second dielectric are substantially a same width.

13. A package comprising:

a substrate;

a die coupled with the substrate, the die including:

a plurality of metal routings, wherein the plurality of metal routings have a pitch of less than 26 nm; and wherein each of the plurality of metal routings is a solid metal feature without an interior void and without an interior seam, wherein one of the plurality of metal features has a first dielectric on a first edge of the metal feature and a second dielectric on a second edge of the metal feature opposite the first edge of the metal feature; and a barrier layer between the first edge of the metal feature and the first dielectric, the barrier layer along less than an entirety of the first edge of the metal feature; and wherein the substrate is electrically coupled with at least some of the metal routings.

14. The package of claim 13, wherein the metal routings include copper.

* * * * *